United States Patent
Gendron-Hansen et al.

(10) Patent No.: US 9,343,456 B2
(45) Date of Patent: May 17, 2016

(54) METAL GATE FOR ROBUST ESD PROTECTION

(71) Applicant: GLOBALFOUNDRIES Inc., Grand Cayman, KY (US)

(72) Inventors: Amaury Gendron-Hansen, San Jose, CA (US); Jagar Singh, Clifton Park, NY (US); Andy Wei, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/477,390

(22) Filed: Sep. 4, 2014

(65) Prior Publication Data

US 2016/0071835 A1    Mar. 10, 2016

(51) Int. Cl.
| | |
|---|---|
| *H01L 27/02* | (2006.01) |
| *H01L 29/739* | (2006.01) |
| *H01L 29/66* | (2006.01) |
| *H01L 29/45* | (2006.01) |
| *H01L 29/423* | (2006.01) |
| *H01L 21/285* | (2006.01) |

(52) U.S. Cl.
CPC ...... *H01L 27/0266* (2013.01); *H01L 21/28568* (2013.01); *H01L 27/0255* (2013.01); *H01L 29/42316* (2013.01); *H01L 29/45* (2013.01); *H01L 29/66356* (2013.01); *H01L 29/7391* (2013.01)

(58) Field of Classification Search
CPC ............ H01L 27/0255; H01L 27/0251; H01L 27/0266; H01L 27/0629; H01L 27/0259
USPC ......................................... 257/356
See application file for complete search history.

(56) References Cited

U.S. PATENT DOCUMENTS

| | | | |
|---|---|---|---|
| 5,767,550 A * | 6/1998 | Calafut et al. ................ 257/355 |
| 7,532,264 B2 * | 5/2009 | Yuan ................... H01L 27/0251 |
| | | | 349/139 |
| 8,779,551 B2 * | 7/2014 | Chou ................ H01L 29/42364 |
| | | | 257/577 |

* cited by examiner

*Primary Examiner* — Monica D Harrison
(74) *Attorney, Agent, or Firm* — Ditthavong & Steiner, P.C.

(57) ABSTRACT

A method of forming a metal gate diode ESD protection device and the resulting device are provided. Embodiments include forming a metal gate diode including a metal gate on a substrate; forming an n-type cathode on a first side of the metal gate diode; and forming a p-type anode on a second side of the metal gate diode, opposite the first side.

20 Claims, 6 Drawing Sheets

METAL GATE FOR ROBUST ESD PROTECTION

TECHNICAL FIELD

The present disclosure relates to protecting semiconductor integrated circuits (ICs) against electrostatic discharge (ESD). The present disclosure is particularly applicable to 14 nanometer (nm) technology nodes and beyond.

BACKGROUND

ESD impact on production yield and product quality is increasingly becoming more significant due to requirements for higher speeds and device scaling. In general, ESD protection devices work by providing a path through the IC that has high current shunting capabilities. Centralized and local clamps are used to allow high ESD current to be discharged to ground. Likewise, forward-biased diodes are also a key protection device. For example, adverting to FIG. 1A, when the IO voltage is greater than VDD, diode 101 provides a discharge path to VSS along path 103. Similarly, when the IO voltage is less than VSS, diode 107 provides a discharge path to VSS along path 109 as depicted in FIG. 1B.

A known approach for an ESD diode includes the use of a polysilicon (poly) gated diode protection device, as illustrated in FIG. 2. As shown, a poly gate 201 with sidewall spacers 203 is formed on a p-well 205 with a p-type source/drain region 207 on one side, acting as an anode, and an n-type source/drain region 209 on the other side, acting as a cathode. Poly gate advantages include low on-state resistance ($R_{on}$), fast turn-on, and self-aligned anode and cathode electrodes. However, polysilicon has low thermal conductivity ($\kappa$) and low heat capacity ($C_V$), which causes high self-heating under the gate and, therefore, low robustness for the device.

A need therefore exists for methodology enabling formation of a gated diode protection device that has low self-heating, and the resulting device.

SUMMARY

An aspect of the present disclosure is a process of forming a metal gated diode protection device.

Another aspect of the present disclosure is a gated diode protection device with the gate formed by a metal layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a metal gate diode including a metal gate on a substrate; forming an n-type cathode on a first side of the metal gate diode; and forming a p-type anode on a second side of the metal gate diode, opposite the first side.

Aspects of the present disclosure include forming the n-type cathode by NFET source/drain process and the p-type anode by PFET source/drain process. Other aspects include forming the metal gate with metal having high $\kappa$ and high $C_V$. Further aspects include forming the metal gate of tungsten (W) or aluminum (Al). Another aspect includes forming the metal gate diode by a replacement metal gate (RMG) process. Additional aspects include forming the metal gate diode by a gate first process. Other aspects include forming the metal gate by forming a metal layer to a thickness of 5 nm to 200 nm.

Another aspect of the present disclosure is a device including: a metal gate diode including a metal gate formed on a substrate; an n-cathode formed on a first side of the metal gate diode; a p-type anode formed on a second side of the metal gate diode, opposite the first side.

Aspects of the device include the metal gate being formed of a metal having high $\kappa$ and high $C_V$. Other aspects include the n-type cathode being formed by NFET source/drain process and the p-type anode being formed by PFET source/drain process. Further aspects include the metal gate being formed of W or Al. Another aspect includes the metal gate being formed to a thickness of 5 nm to 200 nm. Another aspect includes the metal gate diode being formed by a RMG process. Additional aspects include the metal gate diode is formed by a gate first process. Other aspects include the metal gate diode being formed as a PN junction diode.

A further aspect of the present disclosure is a method including: providing an integrated circuit (IC) on a wafer; and providing ESD protection by forming a metal gate diode including a metal gate. Aspects of the present disclosure include forming the metal gate diode as a PN junction diode. Other aspects include forming the metal gate of W or Al. Further aspects include forming the diode by a RMG process. Another aspect includes forming the diode by a gate first process.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purpose of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, and so forth used in the specification and claims are to be understood as being modified in all instances by the term "about."

The present disclosure addresses and solves the current problem of high self-heating attendant upon forming a gated diode ESD protection device having a poly gate. Providing a metal gate that functions as a heat sink on top of the diode reduces the self-heating which in turn increases robustness.

Methodology in accordance with embodiments of the present disclosure includes forming a metal gate diode including a metal gate on a substrate. An n-type cathode is formed on a first side of the metal gate diode and a p-type anode is formed on a second side of the metal gate diode, opposite the first side.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and descriptions are to be regarded as illustrative in nature, and not as restrictive.

Figure 1A:
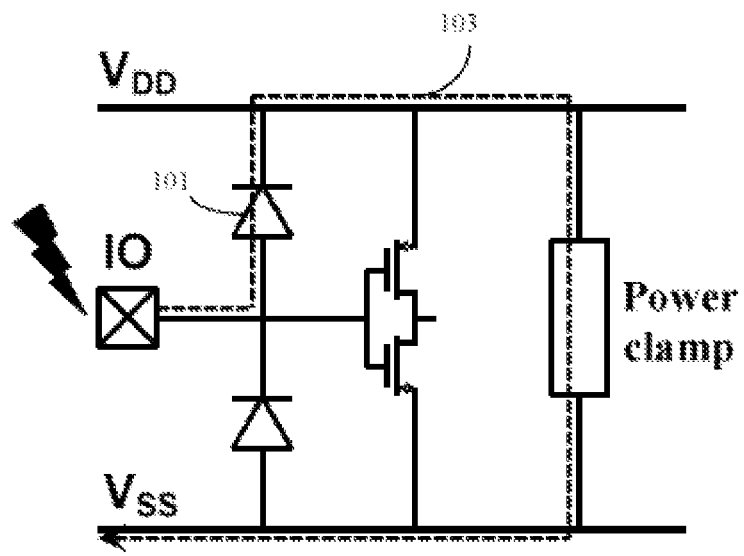
FIGS. 1A and 1B illustrate known positive and negative discharge protection circuits, respectively.
Figure 1B:
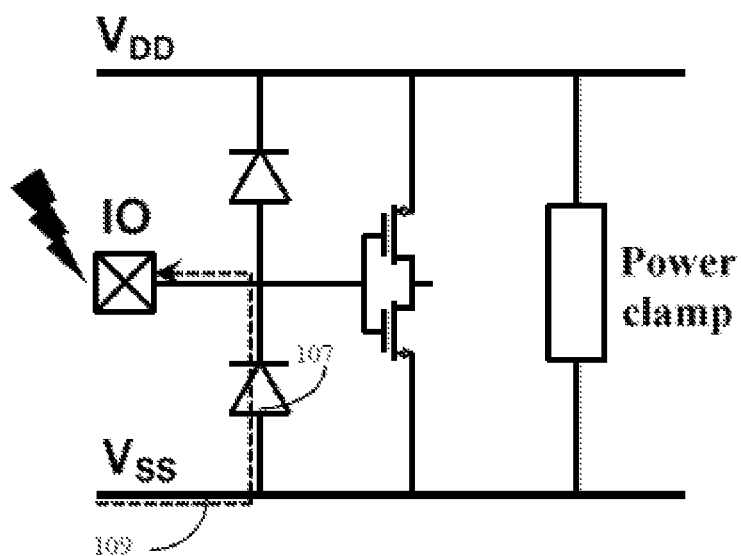
Figure 2:
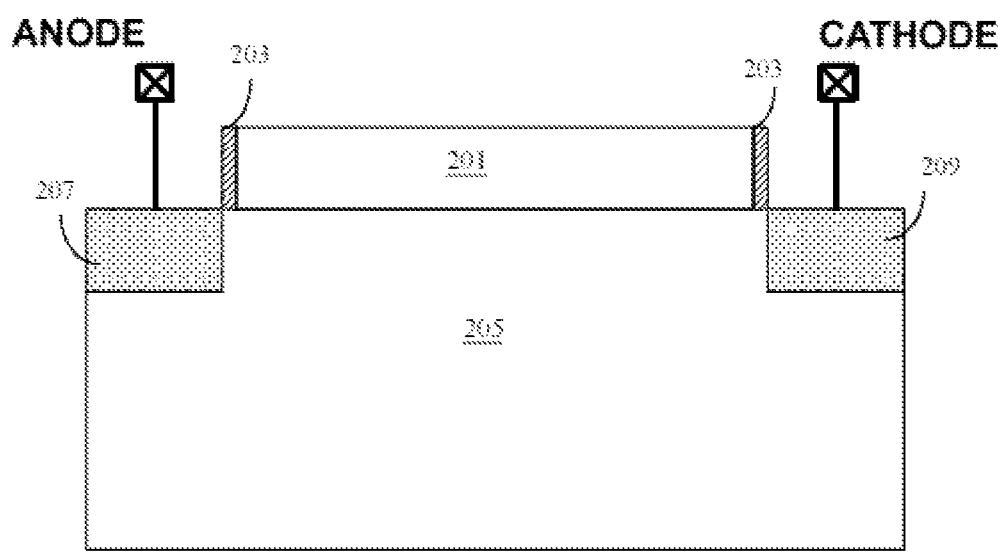
FIG. 2 schematically illustrates a poly gated diode protection device.
Figure 3A:
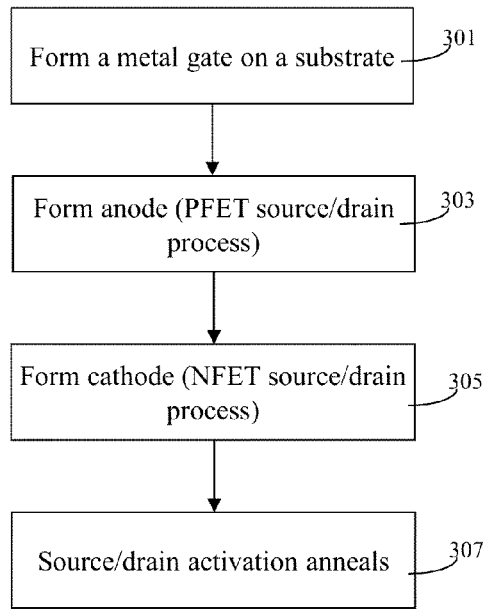
FIGS. 3A and 3B illustrates gate first and gate last process flows, respectively, for forming a metal gated diode protection device, in accordance with an exemplary embodiment.
Figure 3B:
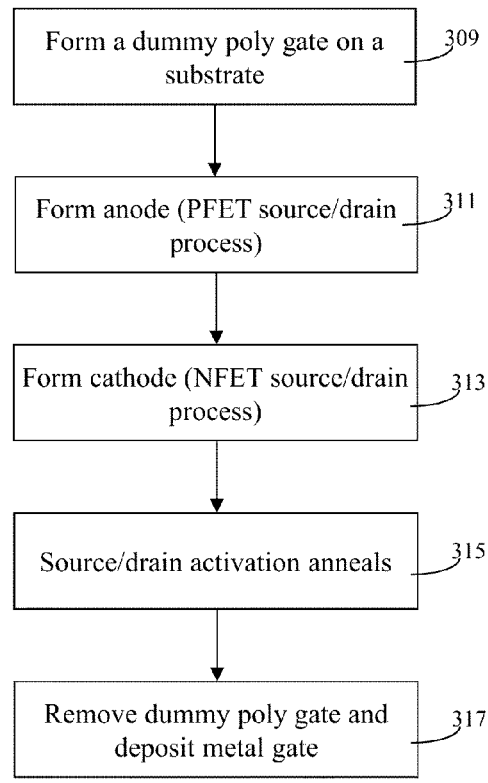
Figure 4:
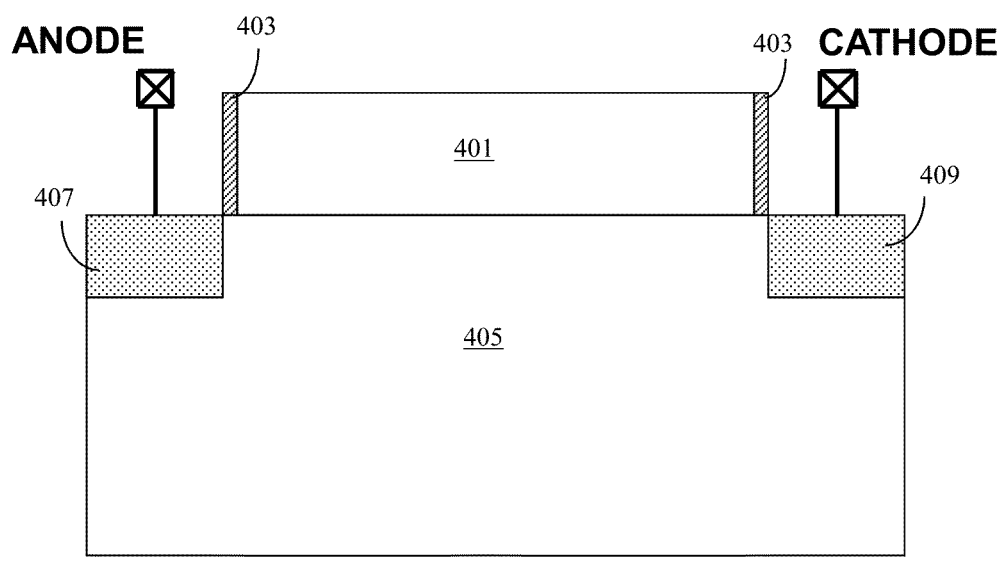
FIG. 4 schematically illustrates a gated diode protection device with a metal heat sink, in accordance with an exemplary embodiment.

FIGS. 3A and 3B illustrate gate first and gate last process flows, respectively, for forming a metal gate diode protection device, as illustrated in FIG. 4, in accordance with an exemplary embodiment. Adverting to step 301 of FIG. 3A, a metal gate 401 with sidewall spacers 403 is formed on a substrate 405 in a gate first process. In step 303, a p-type source/drain 407, e.g., an anode, is formed on one side of the gate electrode 401 and, in step 305, an n-type drain/source 409 e.g., a cathode, is formed on the opposite side of the gate electrode 401. In step 307, source/drain high temperature anneals are performed. The metal gate 401 is particularly effective for a fin-type field-effect transistor (FinFET) device where the gate wraps around the fin rather being formed on a substrate. The metal gate 401 may, for example, be formed by forming a layer of metal that has a high κ and a high $C_V$ value, e.g., W or Al. The metal gate 401 may, for example, be formed to a thickness of 5 nm to 200 nm. In particular, the metal gate 401 functions as a heat sink and thereby reduces the self-heating of the diode.

Adverting to step 309 of FIG. 3B, a dummy poly gate 411 (not shown for illustrative convenience) with sidewall spacers 403 is formed on a substrate 405, where the metal gate 401 was formed in step 301 of FIG. 3A, in a gate last process flow. In step 311, a p-type source/drain 407, e.g., an anode, is formed on one side of the gate electrode and, in step 313, an n-type drain/source 409 e.g., a cathode, is formed on the opposite side of the dummy poly gate 411. In step 315, source/drain high temperature anneals are performed. In step 317, the dummy gate 411 is removed and a metal gate 413 (not shown for illustrative convenience) is formed on top of the substrate 405. Consequently, the resultant device is identical to that of FIG. 4.

Figure 5:
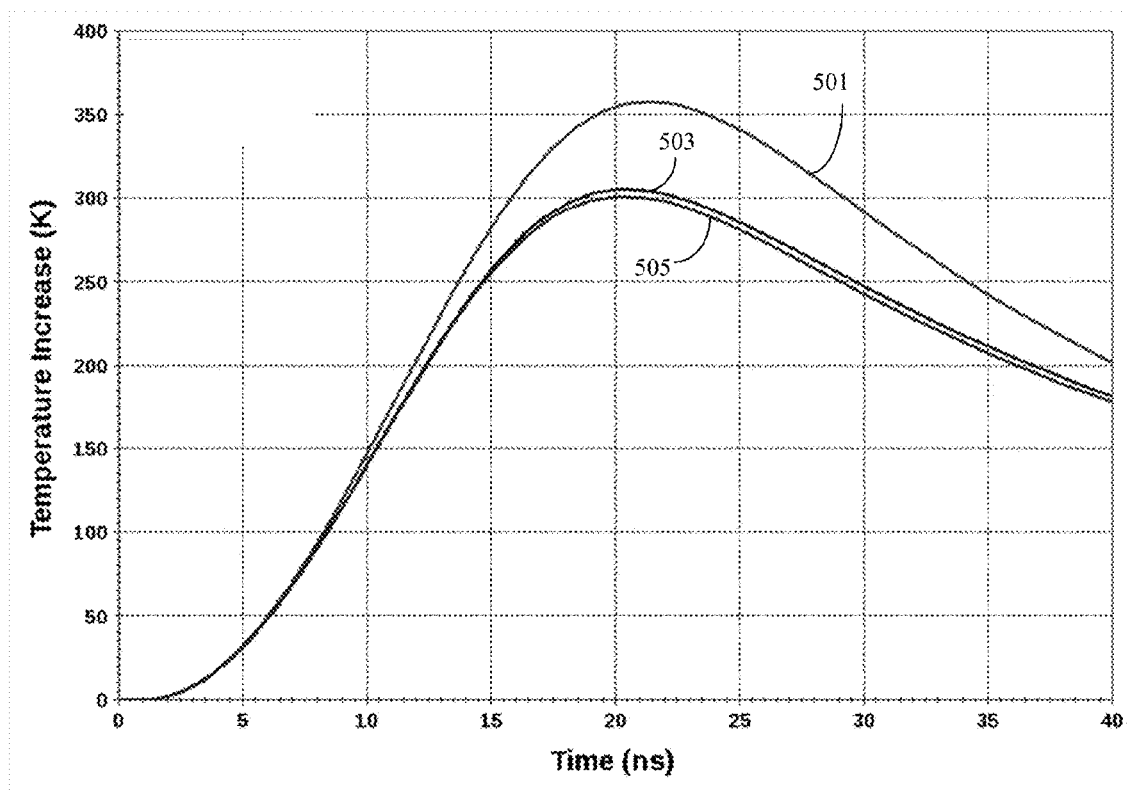
FIG. 5 illustrates maximum temperatures of a poly gate, a W gate, and an Al gate during a 2 kilovolt (kV) human body model (HBM) discharge.
Figure 6:
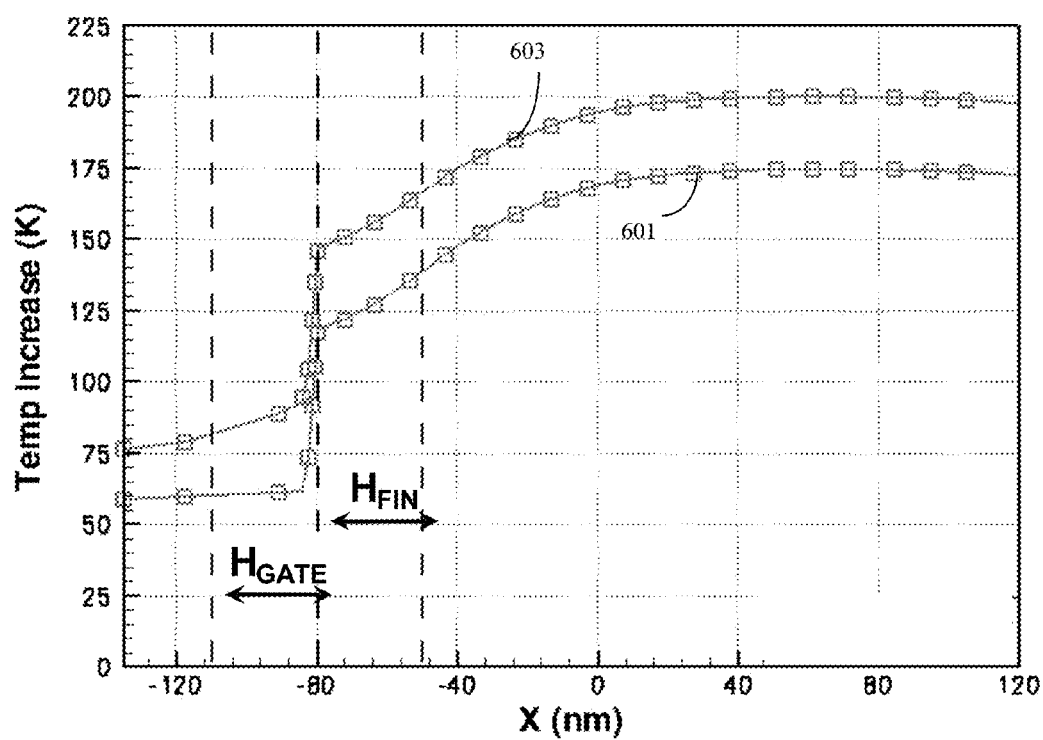
FIG. 6 illustrates temperature increases at the middle of the channel for a poly gate and a W gate.

Whereas polysilicon has a relatively low κ value of 0.15 to 0.40 W·K$^{-1}$·cm$^{-1}$, W has a relatively high κ value of 1.73 W·K$^{-1}$·cm$^{-1}$ and Al has a relatively high κ value of 2.37 W·K$^{-1}$·cm$^{-1}$. Adverting to FIG. 5, during a 2 kV HBM discharge, the change in temperature ($\Delta T$ ($T_{max}-T_{init}$)) is 358.1 K for poly (line 501), 305.5 K for W (line 503), and 301.4 K for Al (line 505), which demonstrates that self-heating is significantly reduced for both W and Al gates as compared to a poly gate. Similarly, FIG. 6 illustrates temperature increases at the middle of the channel for a poly gate and a W gate. For example, the temperatures of the W gate (line 601) are lower across the gate ($H_{Gate}$) and the fin ($H_{Fin}$) than the respective temperatures of the poly gate (line 603), which demonstrates that the lower W gate temperatures enable a reduction of self-heating of the device.

The embodiments of the present disclosure can achieve several technical effects including robust ESD protection due to optimization of the heat diffusion from the silicon to the gate and therefore low self-heating of the protection device. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
  forming a metal gate diode including a metal gate directly contacting a substrate;
  forming an n-type source/drain region in the substrate, a top surface of the n-type source/drain region being aligned with a top surface of the substrate, the n-type source/drain region comprising an n-type cathode on a first side of the metal gate diode; and
  forming a p-type source/drain region in the substrate, a top surface of the p-type source/drain region being aligned with the top surface of the substrate, the p-type source/drain region comprising a p-type anode on a second side of the metal gate diode, opposite the first side.

2. The method according to claim 1, comprising forming the n-type cathode by an NFET source/drain process and the p-type anode by a PFET source/drain process.

3. The method according to claim 1, comprising forming the metal gate with metal having high thermal conductivity (κ) and high heat capacity ($C_V$).

4. The method according to claim 3, comprising forming the metal gate of tungsten (W) or aluminum (Al).

5. The method according to claim 1, comprising forming the metal gate diode by a replacement metal gate (RMG) process.

6. The method according to claim 1, comprising forming the metal gate diode by a gate first process.

7. The method according to claim 1, comprising forming the metal gate by forming a metal layer to a thickness of 5 nanometers (nm) to 200 nm.

8. A device comprising:
  a metal gate diode including a metal gate directly contacting a substrate;

an n-type source/drain region in the substrate, a top surface of the n-type source/drain region being aligned with a top surface of the substrate, the n-type source/drain region comprising an n-type cathode formed on a first side of the metal gate diode;

a p-type source/drain region in the substrate, a top surface of the p-type source/drain region being aligned with the top surface of the substrate, the p-type source/drain region comprising a p-type anode formed on a second side of the metal gate diode, opposite the first side.

9. The device according to claim 8, wherein the metal gate comprises metal having high thermal conductivity ($\kappa$) and high heat capacity ($C_V$).

10. The device according to claim 9, wherein the metal gate comprises tungsten (W) or aluminum (Al).

11. The device according to claim 8, wherein the n-type cathode is formed by NFET source/drain process and the p-type anode is formed by PFET source/drain process.

12. The device according to claim 8, wherein the metal gate is formed to a thickness of 5 nanometers (nm) to 200 nm.

13. The device according to claim 8, wherein the metal gate diode is formed by a replacement metal gate (RMG) process.

14. The device according to claim 8, wherein the metal gate diode is formed by a gate first process.

15. The device according to claim 8, wherein the metal gate diode is formed as a PN junction diode.

16. A method comprising:
providing an integrated circuit (IC) on a wafer; and
providing electrostatic discharge (ESD) protection for the IC by forming a metal gate diode including a metal gate directly contacting the wafer,
wherein an n-type source/drain region is formed in the wafer, a top surface of the n-type source/drain region being aligned with a top surface of the wafer, the n-type source/drain region comprising an n-type cathode on a first side of the metal gate diode; and a p-type source/drain region is formed in the wafer, a top surface of the p-type source/drain region being aligned with the top surface of the wafer, the p-type source/drain region comprising a p-type anode on a second side of the metal gate diode, opposite the first side.

17. The method according to claim 16, comprising forming the metal gate diode as a PN junction diode.

18. The method according to claim 16, comprising forming the metal gate of tungsten (W) or aluminum (Al).

19. The method according to claim 16, comprising forming the diode by a replacement metal gate (RMG) process.

20. The method according to claim 16, comprising forming the diode by a gate first process.

* * * * *